US008102179B2

(12) United States Patent
Mingant et al.

(10) Patent No.: US 8,102,179 B2
(45) Date of Patent: Jan. 24, 2012

(54) METHOD FOR DETERMINING THE STATE OF CHARGE OF A BATTERY IN CHARGING OR DISCHARGING PHASE AT CONSTANT CURRENT

(75) Inventors: Rémy Mingant, Lannilis (FR); Sébastien Martinet, Grenoble (FR); Christine Lefrou, Grenoble (FR)

(73) Assignee: Commisariat A L'Energie Atomique, Paris (FR)

( * ) Notice: Subject to any disclaimer, the term of this patent is extended or adjusted under 35 U.S.C. 154(b) by 433 days.

(21) Appl. No.: 12/458,358

(22) Filed: Jul. 9, 2009

(65) Prior Publication Data
US 2010/0007309 A1 Jan. 14, 2010

(30) Foreign Application Priority Data
Jul. 10, 2008 (FR) ...................................... 08 03939

(51) Int. Cl.
*G01N 27/416* (2006.01)
*H02J 7/00* (2006.01)
(52) U.S. Cl. ........ 324/426; 324/427; 324/429; 324/433; 320/132
(58) Field of Classification Search .................... 324/426
See application file for complete search history.

(56) References Cited

U.S. PATENT DOCUMENTS

| 5,905,358 | A | * | 5/1999 | Fernandez et al. | ............ 320/106 |
| 6,949,911 | B2 | | 9/2005 | Laig-Hoerstebrock et al. | |
| 2002/0036504 | A1 | | 3/2002 | Troy et al. | |
| 2005/0099185 | A1 | * | 5/2005 | Klang | ........................ 324/426 |

FOREIGN PATENT DOCUMENTS

| EP | 0 323 539 A1 | 7/1989 |
| EP | 1 391 742 A2 | 2/2004 |
| EP | 1 736 789 A1 | 12/2006 |
| EP | 1 918 729 A1 | 5/2008 |

OTHER PUBLICATIONS

Piller, S et al., "Methods for State-of-Charge Determination and their Applications," Journal of Power Sources, 2001, vol. 96, pp. 113-120.
Piller, et al., "Methods for State-of-Charge Determination and Their Applications," Journal of Power Sources, 2001, pp. 113-120, vol. 96, Elsevier Science B.V.

* cited by examiner

*Primary Examiner* — Edward Tso
*Assistant Examiner* — Ahmed Omar
(74) *Attorney, Agent, or Firm* — Oliff & Berridge, PLC

(57) ABSTRACT

The method for determining the state of charge of a battery can be used during charging or discharging of the battery at constant current. It comprises placing the battery in open circuit during a recovery period until the voltage at the terminals of said battery stabilizes at a voltage plateau. Then a constant test voltage is applied to the battery terminals during a preset test period. The state of charge of the battery corresponds to the current measured at the end of the test period by means of a previously obtained calibration curve.

6 Claims, 3 Drawing Sheets

METHOD FOR DETERMINING THE STATE OF CHARGE OF A BATTERY IN CHARGING OR DISCHARGING PHASE AT CONSTANT CURRENT

BACKGROUND OF THE INVENTION

The invention relates to a method for determining the state of charge of a battery having a preset rated voltage, comprising a charging or discharging phase of the battery at constant current.

STATE OF THE ART

In lead batteries, the state of charge (SOC) conventionally varies according to the open-circuit voltage of the battery (zero current) over a wide range, for example with an amplitude of more than one Volt, as illustrated in FIG. 1 (article "Methods for state-of-charge determination and their applications" by Sabine Piller et al. published in 2001 in the "Journal of power sources" pages 113 to 120). The state of charge of these batteries can then be determined by a simple potential interpolation the precision of which depends on the precision of the voltage measurement and on the slope of the curve of battery discharge versus its state of charge.

The state of charge can also be determined from measurement of the voltage at non-zero current. The precision then depends on the precision of the voltage measurement, but also on the current, the slope of the curve characteristic of discharging of the battery according to its state of charge, and on the voltage estimation parameters of the battery at non-zero current.

These methods by potential interpolation are not suitable for certain present-day batteries, in particular batteries of lithium-ion type with a cathode made from two-phase material in which the voltage difference between charged state and discharged state is small, as illustrated in FIG. 2.

In known manner, the state of charge of a battery can also be determined by integrating the current versus time. The precision of an estimation using this method depends on the precision of the current measurement. It is also necessary to know the initial capacity of the battery cell, the total load capacity, and the faradic efficiency. One of the major shortcomings of this technology is the accumulation of errors cycle after cycle, inducing increasing uncertainties (dependent on the estimations of initial capacity of the battery cell and on its total capacity). This technique is therefore not applicable for long-term management of a battery.

European Patent application EP0323539 describes a method for determining the state of charge of a Lithium battery. This method enables the state of charge of batteries with discharge curves that are relatively flat to be determined.

OBJECT OF THE INVENTION

The object of the invention is to provide a method for determining the precise state of charge that does not present the shortcomings of the prior art.

This object is achieved by the fact that, in the course of said phase, the method comprises the following successive steps:
  placing the battery in open circuit during a recovery period,
  applying a constant test voltage to the battery terminals during a preset test period,
  measuring the current at the end of the test period, and
  determining the state of charge corresponding to said current measured at the end of the test period by means of a calibration curve.

BRIEF DESCRIPTION OF THE DRAWINGS

Other advantages and features will become more clearly apparent from the following description of particular embodiments of the invention, given as non-restrictive examples only and represented in the accompanying drawings in which.

DESCRIPTION OF PARTICULAR EMBODIMENTS

Figure 1:
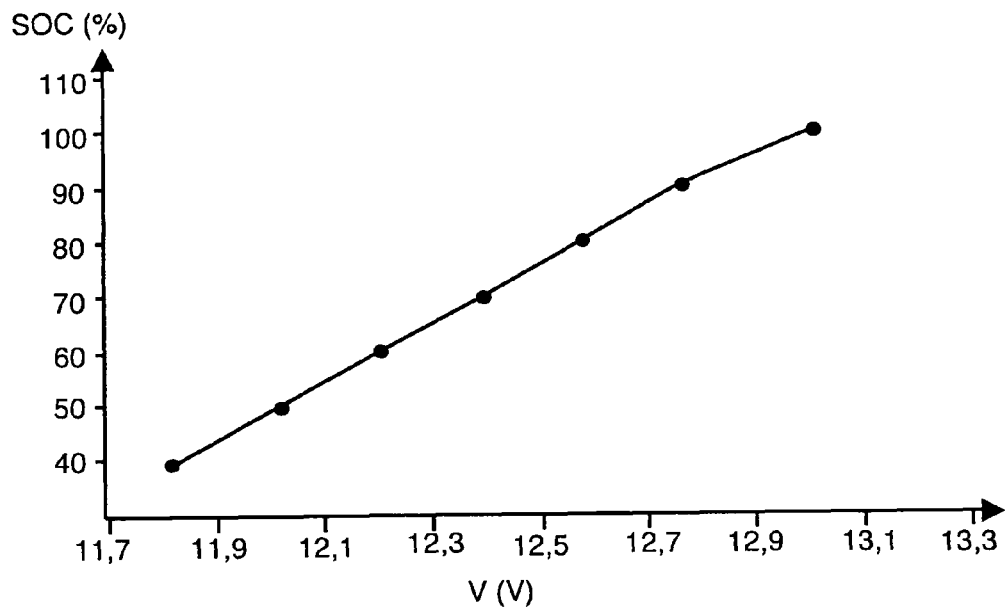
FIG. 1 represents a curve determining the state of charge of a battery by means of an open-circuit voltage measurement, according to the prior art.
Figure 2:
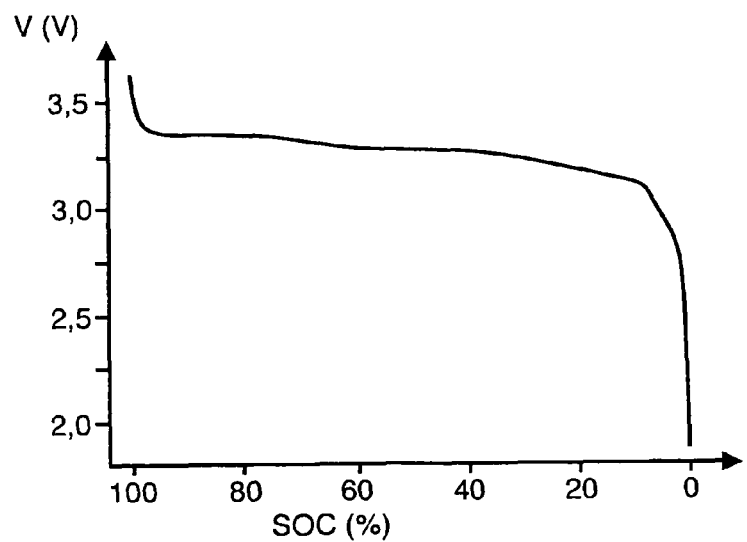
FIG. 2 illustrates the variation of the open-circuit voltage versus the state of charge of a lithium-ion battery.
Figure 3:
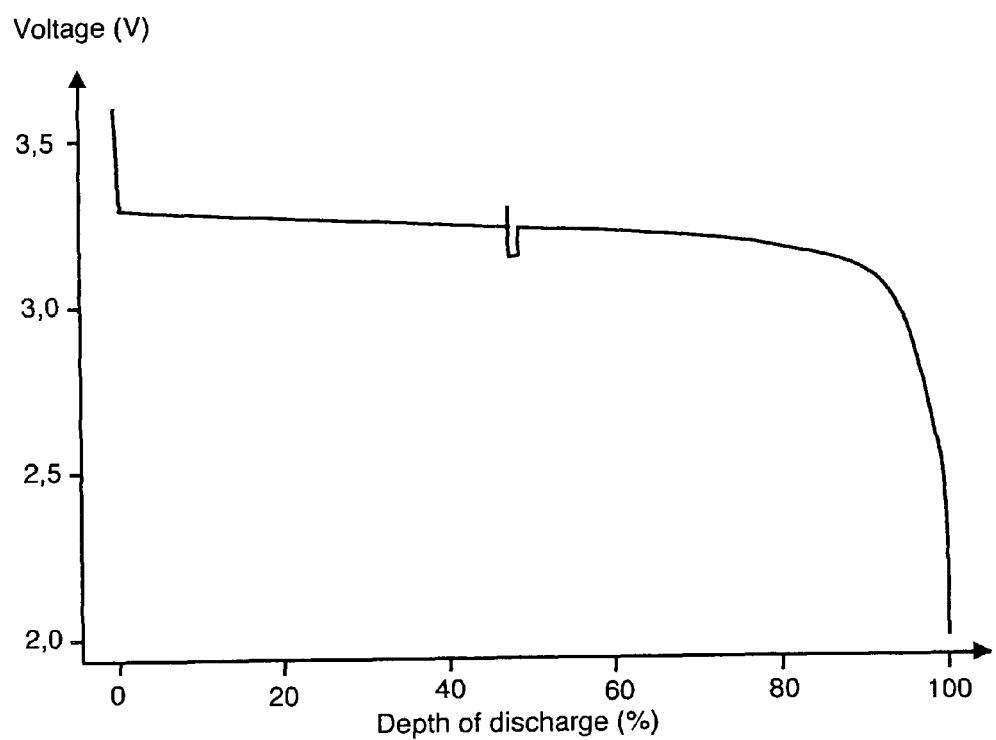
FIG. 3 represents the progression of the voltage versus the depth of discharge of the battery during discharging at constant current.
Figure 4:
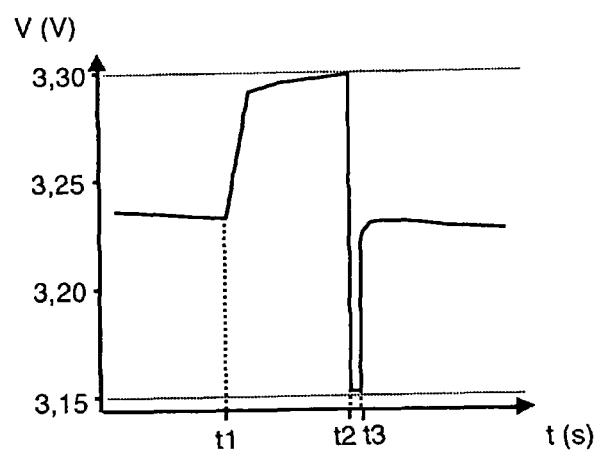
FIG. 4 represents the progression of the voltage of the battery versus time during a state-of-charge determination phase according to the invention.
Figure 5:
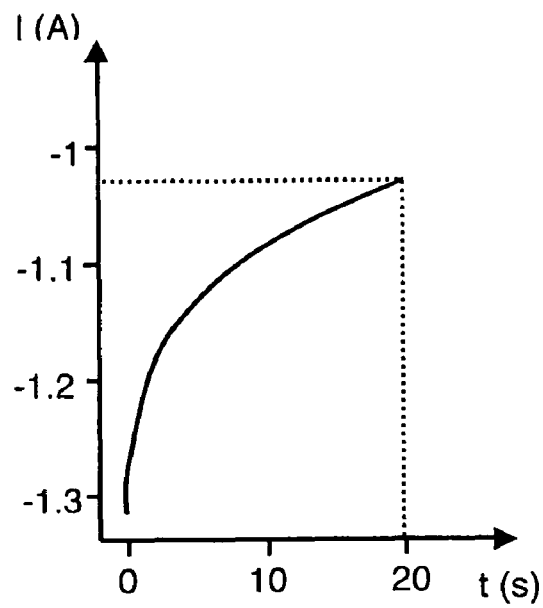
FIG. 5 represents the progression of the resulting current versus time between times t2 and t3 of FIG. 4.

As illustrated in FIGS. 3 to 5, to determine the state of charge of the battery, which is of preset rated voltage, during a charging or discharging phase at constant current, the battery is first of all placed in recovery (at time t1 in FIG. 4), i.e. the battery is placed in open circuit and no longer consumes current. This placing in recovery period initially gives rise to a variation of the voltage at the terminals of the battery until a plateau voltage corresponding to a stable voltage state is reached. This variation corresponds to a voltage increase if the battery was in discharging phase (FIGS. 3 and 4) or to a voltage drop if the battery was in charging phase. The recovery period (t1-t2) of the battery is preferably longer than or equal to 30 s, preferably of sufficient duration for the plateau voltage to be reached.

A constant test voltage is then applied to the battery terminals (at time t2 in FIG. 4) during a preset test period (t2-t3), preferably shorter than or equal to 30 s. The test period does in fact have to remain short so as to affect the state-of-charge value to be determined as little as possible. This test voltage, which is constant, is lower than the rated voltage of the battery if determination of the state of charge is performed during a discharging phase and higher than the rated voltage if determination of the state of charge is performed during a charging phase. Applying a constant test voltage gives rise to a variation of the resulting current I in the battery. As illustrated in FIG. 5 which corresponds to a discharging phase, current I increases during the test period. At the end of the test period, the resulting current I is measured. This current measured at the end of the test period is used to determine the state of charge of the battery from a calibration curve obtained previously from at least one reference battery and supplying the relation (FIG. 6) between the current measured at the end of the test period (discharging or charging at constant voltage) and the state of charge of the battery. Thus the calibration curve can be established, from at least one reference battery, by measuring the current value at the end of a test period at constant voltage for a plurality of known state-of-charge values of the reference battery.

Figure 6:
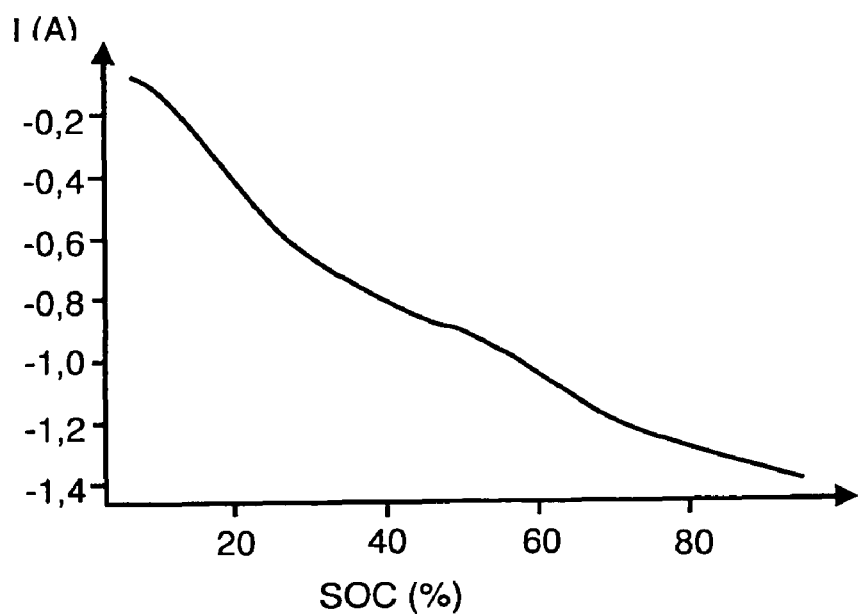
FIG. 6 illustrates a calibration curve representative of the current at the end of the test period versus the state of charge.

The calibration curve, illustrated in FIG. 6, was for example obtained from two reference battery cells by measuring the current at the end of the test period at constant voltage for different states of charge and with several discharging regimes. A calibration curve can be obtained in like manner for determining the state of charge during charging at constant current. The reproducibility of measurement is dependable as the standard deviation obtained is less than 5%.

For example purposes, the method described above was used for a $LiFePO_4/LiC_6$ battery with a capacity of 1.4 Ah during a discharging phase of this battery at constant current. FIG. 3 represents the progression of the voltage versus the depth of discharge during the state-of-charge determination phase. FIG. 4 illustrates in detail the behavior of the battery voltage versus time during the battery state-of-charge determination phase. The recovery period (I=0) thus begins at a time t1 and the duration of the recovery period (t1-t2) is about 600 seconds. The voltage goes from 3.24V at time t1 to a plateau voltage of 3.3V. At time t2, the battery is discharged with a constant discharging voltage of 3.15 V during a test period (t2-t3) with a duration of 20 s. The current I measured at time t3 at the end of the test period is −1.03 A (FIG. 5). Entering this value on the calibration curve of FIG. 6 enables the state of charge of the corresponding battery to be determined, i.e. 60% in the example considered.

This method can also for example be used to determine the state of charge of a 1.3 mAh $LiFePO_4/Li_4Ti_5O_{12}$ button cell during discharging at constant current. After a recovery period (t1-t2) of 60 s, an imposed test voltage of 1.84V was applied for 30 s. The current measured at the end of the recovery period enables the state of charge of the cell to be determined from a corresponding calibration curve.

The test voltage in particular partly depends on the properties of the electrodes used.

The durations of the recovery and test periods are determined according to the type of battery concerned. For example rapid recharge batteries such as batteries with negative electrodes made from $Li_4Ti_5O_{12}$ require shorter times (for example about 30 seconds recovery period and 1 second test period). Slower recharge batteries such as batteries with negative electrodes made from $LiC_6$ on the other hand require longer times (600 seconds recovery period and 20 to 30 seconds test period).

The precision of measurement (less than 10% of the total capacity) is better than in the state of the art.

This particularly advantageous method can be applied in the photovoltaic field. It can also be applied in the field of mobile equipment such as telephones and computers, or in the field of hybrid and electric vehicles where it is critical to use precise charge gauges.

The invention claimed is:

1. A method for determining the state of charge of a battery having a preset rated voltage, comprising a charging or discharging phase of the battery at constant current, wherein, in the course of said phase, the method comprises the following successive steps:
   placing the battery in open circuit during a recovery period,
   applying a constant test voltage to the battery terminals during a preset test period,
   measuring the current at the end of the test period, and
   determining the state of charge corresponding to said current measured at the end of the test period by means of a calibration curve.

2. The method according to claim 1, wherein the battery being in discharging phase, the test voltage is lower than the rated voltage of the battery.

3. The method according to claim 1, wherein the battery being in charging phase, the test voltage is greater than the rated voltage of the battery.

4. The method according to claim 1, wherein the duration of the recovery period is greater than or equal to 30 seconds.

5. The method according to claim 1, wherein the test period is shorter than or equal to 30 seconds.

6. The method according to claim 1, wherein the calibration curve is established, from at least one reference battery, by measuring the current value at the end of a test period at constant voltage for a plurality of known state-of-charge values of the reference battery.

* * * * *